(12) United States Patent
Kim et al.

(10) Patent No.: US 12,389,748 B2
(45) Date of Patent: Aug. 12, 2025

(54) DISPLAY DEVICE

(71) Applicant: Samsung Display Co., LTD., Yongin-si (KR)

(72) Inventors: Sun Ho Kim, Seongnam-si (KR); Kyung Hoe Lee, Hwaseong-si (KR); Kyung Hoon Chung, Yongin-si (KR); Ji-Sun Kim, Seoul (KR); Yoo Min Ko, Suwon-si (KR); Hye Won Kim, Seoul (KR); Ju Chan Park, Seoul (KR); Pil Suk Lee, Suwon-si (KR); Chung Sock Choi, Seoul (KR); Sung Jin Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 448 days.

(21) Appl. No.: 17/895,426

(22) Filed: Aug. 25, 2022

(65) Prior Publication Data

US 2023/0200130 A1 Jun. 22, 2023

(30) Foreign Application Priority Data

Dec. 16, 2021 (KR) .......................... 10-2021-0180603

(51) Int. Cl.
 *H10K 59/131* (2023.01)
 *H10K 59/121* (2023.01)
(52) U.S. Cl.
 CPC ....... *H10K 59/1213* (2023.02); *H10K 59/131* (2023.02)

(58) Field of Classification Search
 CPC .......................... H10K 59/131; H10K 59/121
 See application file for complete search history.

(56) References Cited

U.S. PATENT DOCUMENTS

2012/0268002 A1 10/2012 Osako et al.
2019/0379002 A1* 12/2019 Abe ..................... H10K 59/131

FOREIGN PATENT DOCUMENTS

| CN | 111863897 | 10/2020 |
|---|---|---|
| KR | 10-2017-0114040 | 10/2017 |
| KR | 10-2018-0018960 | 2/2018 |
| KR | 10-2021-0084733 | 7/2021 |
| KR | 10-2021-0149279 | 12/2021 |
| KR | 10-2022-0034952 | 3/2022 |

* cited by examiner

*Primary Examiner* — Kevin M Nguyen
(74) *Attorney, Agent, or Firm* — KILE PARK REED & HOUTTEMAN PLLC

(57) ABSTRACT

A display device includes a substrate including a first display area and a second display area; a first pixel circuit part disposed on the first display area of the substrate; a first light-emitting device connected to the first pixel circuit part; a second pixel circuit part disposed on the second display area of the substrate; a second light-emitting device connected to the second pixel circuit part; and a signal transfer wire that overlaps the second light-emitting device. The signal transfer wire includes subwires spaced apart from each other, and a bridge wire extending from the subwires.

20 Claims, 15 Drawing Sheets

DISPLAY DEVICE

CROSS-REFERENCE TO RELATED APPLICATION(S)

This application claims priority to and benefits of Korean Patent Application No. 10-2021-0180603 under 35 U.S.C. § 119, filed in the Korean Intellectual Property Office on Dec. 16, 2021, the entire contents of which are incorporated herein by reference.

BACKGROUND

1. Technical Field

The present disclosure relates to a display device.

2. Description of the Related Art

A display device is generally to display images in a screen, and in general includes a liquid crystal display, an organic light emitting diode display, and the like. A display device is employed or included in various electronic devices such as mobile phones, navigation units, digital cameras, electronic books, portable game machines, and various terminals.

A display device may include a display area on which a screen or an image is displayed and a peripheral area in which no image is displayed. Pixels may be positioned in the display area of a display device in a row direction and a column direction. Various elements such as transistors, capacitors, and wires for supplying signals may be disposed in each of the pixels. Various wires, a scan driver, a data driver, a controller, etc. may be disposed in the peripheral area to transfer electrical signals to drive these pixels.

There has been a demand to reduce the peripheral area and enlarge the display area of display devices. However, there has also been difficulties in reducing the peripheral area or its size because an area occupied by the drivers increases to accomplish high resolution and high-speed driving.

The above information disclosed in this Background section is only for enhancement of understanding of the background of the described technology, and therefore, it may contain information that does not form the prior art that is already known in this country to a person of ordinary skill in the art.

SUMMARY

Embodiments have been made in an effort to provide a display device having a display area that is extended or expanded.

Embodiments have been made in an effort to provide a display device capable of preventing defects from occurring due to an influence of electrodes, wires, and light-emitting devices positioned on an insulating layer by a gas remaining inside the insulating layer in an extended or expanded display area.

In an embodiment, a display device may include a substrate including a first display area and a second display area; a first pixel circuit part disposed on the first display area of the substrate; a first light-emitting device connected to the first pixel circuit part; a second pixel circuit part disposed on the second display area of the substrate; a second light-emitting device connected to the second pixel circuit part; and a signal transfer wire that overlaps the second light-emitting device, wherein the signal transfer wire may include a plurality of subwires spaced apart from each other, and a bridge wire extending from the subwires.

The signal transfer wire may transfer a constant voltage.

The signal transfer wire may include at least one of a gate voltage transfer wire, a first initialization voltage transfer wire, and a second initialization voltage transfer wire.

According to an embodiment, the display device may further include a driving circuit part connected to the first pixel circuit part and the second pixel circuit part. The driving circuit part may overlap the second light-emitting device.

The signal transfer wire may be positioned between the driving circuit part and the second light-emitting device.

According to an embodiment, the display device may further include a first passivation layer disposed between the signal transfer wire and the driving circuit part, and the first passivation layer includes an organic insulating material.

The driving circuit part may include a scan driver generating a scan signal, and the gate voltage transfer wire may be connected to the scan driver.

The substrate may include a display area displaying the image and a peripheral area surrounding the display area, the display area may include a first display area and a second display area, and the second display area may be positioned between the first display area and the peripheral area.

A portion of the driving circuit part may overlap the second light-emitting device in the second display area, and another portion of the driving circuit part may be positioned in the peripheral area.

The signal transfer wire may include first and second subwires spaced apart from each other, and a plurality of bridge wires that connect the first subwire and the second subwire.

The bridge wires may extend in parallel along a first direction, and the first subwire and the second subwire may extend in parallel in a second direction that is perpendicular to the first direction.

The signal transfer wire may further include an opening surrounded by the first subwire, the second subwire, and the bridge wires.

The opening may have a polygonal or circular planar shape.

The signal transfer wire may include a plurality of openings, and the openings may be spaced apart from each other.

The signal transfer wire may include a plurality of openings, and each of the openings may have a selectable size.

The signal transfer wire may include a first subwire, a second subwire, and a third subwire spaced apart from each other, a first bridge wire extending from the first subwire and the second subwire, and a second bridge wire extending from the second subwire and the third subwire.

The first bridge wire and the second bridge wire may be positioned on a same extension line.

The first bridge wire and the second bridge wire may be positioned to cross each other.

The second pixel circuit part may be connected to a plurality of second light-emitting devices.

According to an embodiment, the display device may further include an extension wire connected to the second pixel circuit part, wherein the second light-emitting devices may be connected to the second pixel circuit part through the extension wire.

In the embodiments, provided is a display device with an extended or expanded display area.

It is also possible to prevent occurrence of defects in electrodes, wires, and light-emitting devices positioned in the extended or expanded display area.

DETAILED DESCRIPTION OF THE EMBODIMENTS

Figure 1:
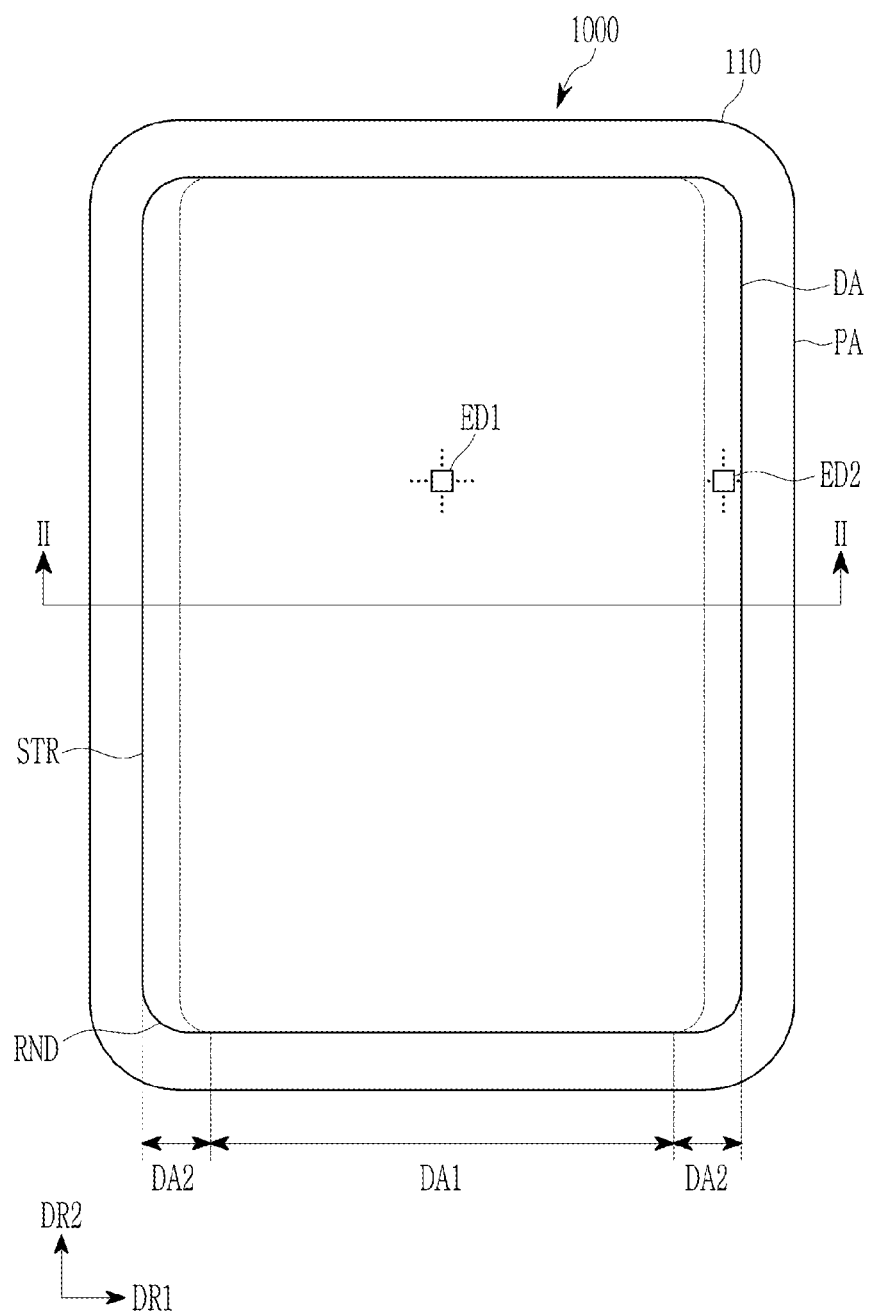
FIG. 1 illustrates a top plan view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

To clearly describe the disclosure, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction. It will be understood that the terms "contact," "connected to," and "coupled to" may include a physical and/or electrical contact, connection, or coupling.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

First, a display device according to an embodiment will be described with reference to FIGS. 1 and 2.

Figure 2:
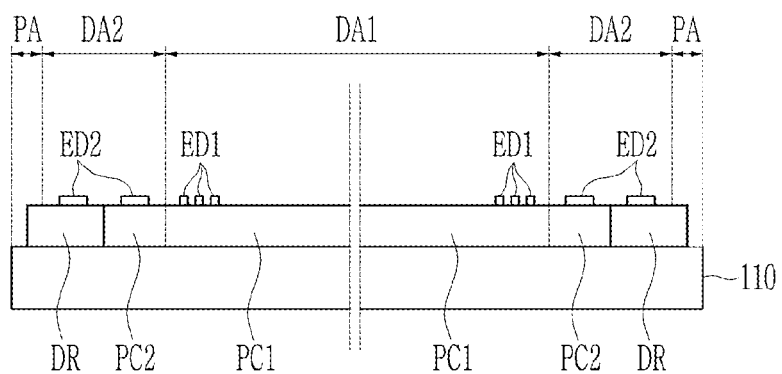
FIG. 2 illustrates a cross-sectional view taken along line II-II of FIG. 1.

FIG. 1 illustrates a schematic top plan view of a display device according to an embodiment, and FIG. 2 illustrates a schematic cross-sectional view taken along line II-II of FIG. 1.

As illustrated in FIGS. 1 and 2, a display device 1000 according to an embodiment includes a substrate 110 and light-emitting devices ED1 and ED2 positioned on the substrate 110.

The substrate 110 includes a display area DA and a peripheral area PA adjacent to the display area DA.

The display area DA may be positioned at a central portion of the display device 1000, may have a substantially rectangular shape, and each corner thereof may have a rounded shape. For example, an edge of the display area DA may include a straight portion STR having a straight shape and a rounded portion RND having a rounded shape. However, the shape of the display area DA and the shape of the corner are not limited thereto, and may be variously changed. The display area DA may include a first display area DA1 and a second display area DA2 adjacent to the first display area DA1. The first display area DA1 may be positioned at a central portion of the display area DA, and the second display area DA2 may be positioned at opposite sides of the first display area DA1, for example, at left and right sides. However, this is only an example, and positions of the first display area DA1 and the second display area DA2 may be variously changed. For example, the first display area DA1 may have a substantially quadrangular shape, and the second display area DA2 may be positioned to surround four corners of the first display area DA1. For example, the second display area DA2 may be positioned to left, right, upper, and lower sides of the first display area DA1.

The periphery area PA may surround the display area DA. The peripheral area PA is an area in which no image is displayed and may be positioned at an outer portion of the display device 1000.

The light-emitting devices ED1 and ED2 may emit light. For example, the light-emitting devices ED1 and ED2 may emit red, green, blue, or white light. The display device 1000 may display an image by light emitted from the light-emitting devices ED1 and ED2. The light-emitting devices ED1 and ED2 may include a first light-emitting device ED1 and a second light-emitting device ED2. The light-emitting devices ED1 and ED2 may be positioned in the display area DA. The first light-emitting device ED1 may be positioned in the first display area DA1, and the second light-emitting device ED2 may be positioned in the second display area DA2. Although not illustrated, the display device 1000 according to an embodiment may include first light-emitting devices ED1 and second light-emitting devices ED2. First light-emitting devices ED1 may be positioned in a first direction DR1 and a second direction DR2 in the first display area DA1, and second light-emitting devices ED2 may be positioned in the first direction DR1 and the second direction DR2 in the second display area DA2. The second direction DR2 may be perpendicular to the first direction DR1. For example, the first direction DR1 may be a row direction, and the second direction DR2 may be a column direction. Sizes of the first light-emitting elements ED1 and the second light-emitting elements ED2 may be the same or different. For example, a size of the second light-emitting device ED2 may be larger than that of the first light-emitting device ED1. A number of first light-emitting elements ED1 per unit area and a number of second light-emitting elements ED2 per unit area may be the same or different. For example, a number of second light-emitting devices ED2 per unit area may be smaller than that of first light-emitting devices ED1 per unit area. Resolutions of the first display area DA1 and the second display area DA2 may be the same or different. For example, a resolution of the first display area DA1 may be higher than that of the second display area DA2. An arrangement form and size of the first light-emitting device ED1 and the second light-emitting device ED2, and resolutions of the first display area DA1 and the second display area DA2, etc. are not limited thereto, and may be changed in various ways.

The display device 1000 according to an embodiment may further include pixel circuit parts PC1 and PC2 positioned on the substrate 110. The pixel circuit parts PC1 and PC2 may include a first pixel circuit part PC1 and a second pixel circuit part PC2. Although not illustrated, the display device 1000 according to an embodiment may include first pixel circuit parts PC1 and second pixel circuit parts PC2. The first pixel circuit part PC1 refers to a region in which the first pixel circuit parts PC1 are substantially arranged in the first direction DR1 and the second direction DR2, and the second pixel circuit part PC2 refers to a region in which the second pixel circuit parts PC2 are substantially arranged in the first direction DR1 and the second direction DR2. An arrangement form of the pixel circuit parts PC1 and PC2 is not particularly limited, and may be arranged to have various forms. The first pixel circuit part PC1 may be positioned in the first display area DA1, and the second pixel circuit part PC2 may be positioned in the second display area DA2. Each of the pixel circuit parts PC1 and PC2 may be connected to at least one of the light-emitting devices ED1 and ED2. The first pixel circuit part PC1 may be connected to the first light-emitting device ED1, and the second pixel circuit part PC2 may be connected to the second light-emitting device ED2. In this case, the second pixel circuit part PC2 may be connected to at least one second light-emitting device ED2. Sizes of a first pixel circuit part PC1 and a second pixel circuit part PC2 may be the same or different. For example, the size of a second pixel circuit part PC2 may be larger than that of a first pixel circuit part PC1. Structures of the first pixel circuit part PC1 and the second pixel circuit part PC2 may be different.

The display device 1000 according to an embodiment may further include a driving circuit part DR positioned on the substrate 110. The driving circuit part DR may be connected to the first pixel circuit part PC1 and the second pixel circuit part PC2. The driving circuit part DR may include drivers and signal wires. For example, the driving circuit part DR may include a scan driver, a data driver, and the like. The scan driver generates a scan signal and transfers it to the pixel circuit parts PC1 and PC2 through scan lines. The data driver generates a data signal and transfers it to the pixel circuit parts PC1 and PC2 through data lines.

Various signal transfer wires may be positioned on the substrate 110. Examples of the signal transfer wires may include a gate voltage transfer wire connected to the scan driver to supply a high gate voltage or a low gate voltage, a first initialization voltage transfer wire for transferring a first initialization voltage, and a second initialization voltage transfer wire for transferring a second initialization voltage, and the like. Other examples may include a driving voltage supply line for transferring a driving voltage to each of the pixel circuit parts PC1 and PC2, a common voltage supply line for transferring a common voltage to an electrode of each of the light-emitting devices ED1 and ED2, and the like.

At least a portion of the driving circuit part DR and the signal transfer wires may be positioned in the second display area DA2, and another portion (e.g., a remaining portion) may be positioned in the peripheral area PA.

In the first display area DA1, the first pixel circuit part PC1 may be electrically connected to the first light-emitting device ED1 positioned on the first pixel circuit part PC1. In this case, the emission area of the first light-emitting device ED1 may overlap the first pixel circuit part PC1 connected thereto. The first display area DA1 is an area from which light is emitted by the first light-emitting device ED1.

In the second display area DA2, the second pixel circuit part PC2 may be electrically connected to the second-light-emitting device ED2 that are spaced apart from each other by a distance. In this case, the emission area of the second light-emitting device ED2 may not overlap the second pixel circuit part PC2 connected thereto. The emission area of the second light-emitting device ED2 may overlap the second pixel circuit part PC2 that is not connected thereto. The emission area of the second light-emitting device ED2 may overlap the driving circuit part DR. A portion of the emission area of the second light-emitting device ED2 may overlap the second pixel circuit part PC2 connected thereto. The second display area DA2 is an area from which light is emitted by the second light-emitting device ED2.

In the case of a typical display device, a pixel circuit part and a light-emitting device are positioned in a display area, and the driving circuit part is positioned in a peripheral region surrounding the display area, and the pixel circuit part and the light-emitting device are not positioned. Accordingly, no light is emitted from the peripheral area in which the driving circuit part is positioned, and a dead space is formed. In the display device according to the embodiment, the second light-emitting device ED2 is positioned at a portion where the driving circuit part DR is positioned to emit light, so that an area on which an image is displayed may be expanded. For example, the dead space may be reduced and a bezel may be reduced by positioning the second light-emitting device ED2 on the driving circuit part DR.

Hereinafter, a connection relationship between each pixel circuit part of the display device and the light-emitting device according to an embodiment will be described with reference to FIG. 3.

Figure 3:
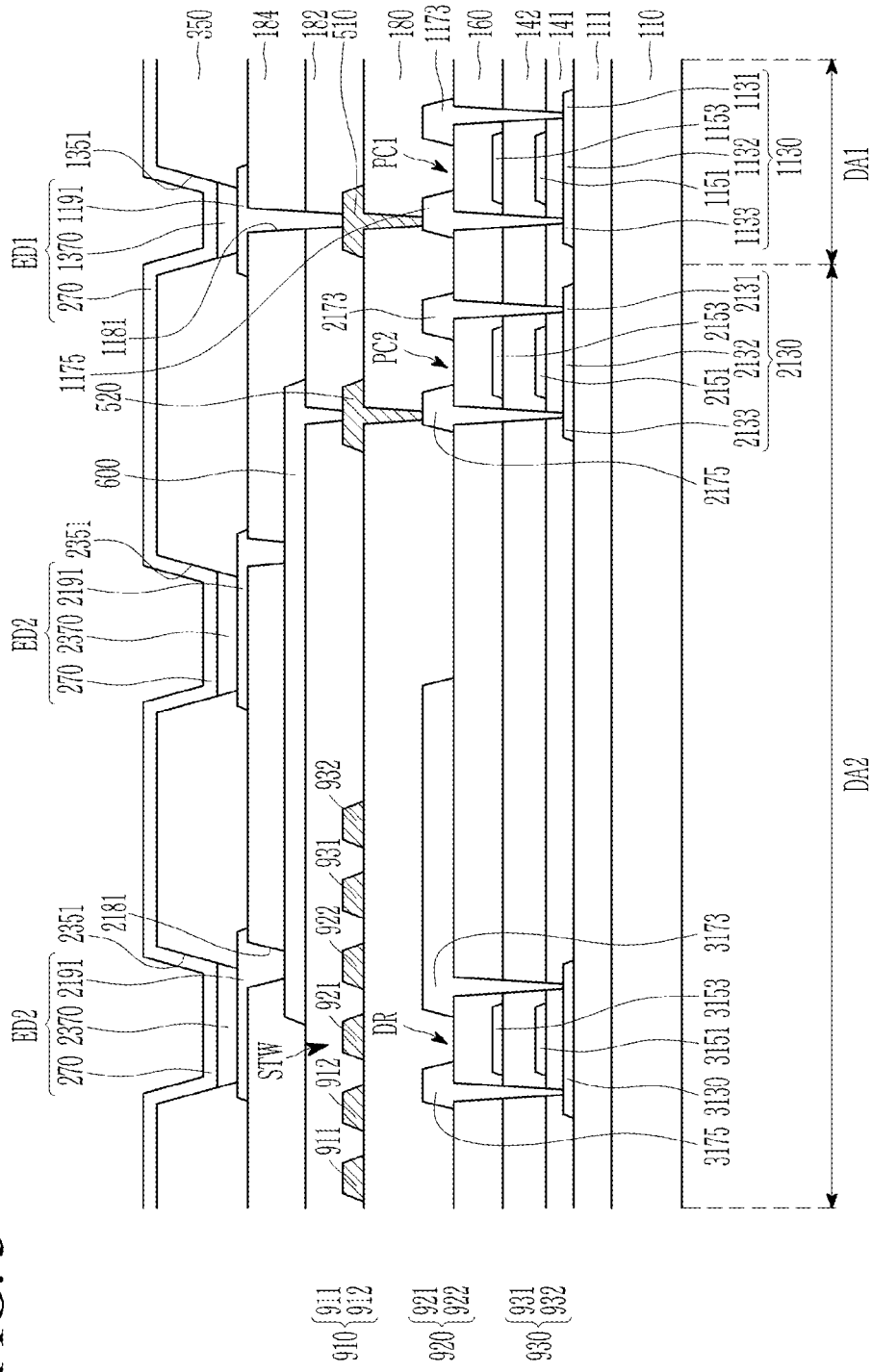
FIG. 3 illustrates a cross-sectional view showing a portion of a display device according to an embodiment.

FIG. 3 illustrates a schematic cross-sectional view illustrating a portion of a display device according to an embodiment. FIG. 3 illustrates a portion of the first display area and a portion of the second display area.

As illustrated in FIG. 3, the emission area of the first light-emitting device ED1 of the display device according to an embodiment may overlap the first pixel circuit part PC1 connected to the first light-emitting device ED1.

The first pixel circuit part PC1 may include a semiconductor 1130, a gate electrode 1151, a source electrode 1173, and a drain electrode 1175 positioned on the first display area DA1 of the substrate 110.

The substrate 110 may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that can be bent or folded, and may be a single layer or multiple layers.

A buffer layer 111 may be disposed on the substrate 110. The buffer layer 111 may have a single or multi-layered structure. The buffer layer 111 may include an inorganic insulating material or organic insulating material such as a silicon nitride ($SiN_x$), a silicon oxide ($SiO_x$), and a silicon oxynitride ($SiO_xN_y$). The buffer layer 111 may be omitted in some embodiments. A barrier layer may be further disposed between the substrate 110 and the buffer layer 111. The buffer layer may have a single or multi-layered structure.

The barrier layer may include an inorganic insulating material such as a silicon nitride (SiN$_x$), a silicon oxide (SiO$_x$), and a silicon oxynitride (SiO$_x$N$_y$).

A semiconductor layer including the semiconductor 1130 of the first pixel circuit part PC1 may be positioned on the buffer layer 111. The semiconductor 1130 may include a first region 1131, a channel 1132, and a second region 1133. The first region 1131 and the second region 1133 may be respectively positioned at opposite sides of the channel 1132 of the semiconductor 1130 of the first pixel circuit part PC1. The semiconductor 1130 of the first pixel circuit part PC1 may include a semiconductor material such as amorphous silicon, polycrystalline silicon, or an oxide semiconductor. The first pixel circuit part PC1 may include transistors, and in this case, some of the transistors may include a semiconductor made of polycrystalline silicon, and other transistors may include a semiconductor made of an oxide semiconductor. In this case, the semiconductor made of polycrystalline silicon and the oxide semiconductor may be positioned on different layers.

A first gate insulating layer 141 may be positioned on the semiconductor 1130 of the first pixel circuit part PC1. The first gate insulating layer 141 may have a single or multi-layered structure. The first gate insulating layer 141 may include an inorganic insulating material such as a silicon nitride (SiN$_x$), a silicon oxide (SiO$_x$), and a silicon oxynitride (SiO$_x$N$_y$).

A first gate conductive layer including the gate electrode 1151 of the first pixel circuit part PC1 may be positioned on the first gate insulating layer 141. The gate electrode 1151 of the first pixel circuit part PC1 may overlap the channel 1132 of the semiconductor 1130. The first gate conductive layer may have a single or multi-layered structure. The first gate conductive layer may include a metal material such as molybdenum (Mo), aluminum (Al), copper (Cu), and/or titanium (Ti). After the first gate conductive layer is formed, a doping process or plasma treatment may be performed. A portion of the semiconductor layer covered by the first gate conductive layer is not subjected to doping or plasma treatment, and a portion of the semiconductor layer which is not covered by the first gate conductive layer may be doped or treated with plasma to have the same characteristic as that of a conductor.

A second gate insulating layer 142 may be positioned on the first gate conductive layer including the gate electrode 1151 of the first pixel circuit part PC1. The second gate insulating layer 142 may have a single or multi-layered structure. The second gate insulating layer 142 may include an inorganic insulating material such as a silicon nitride (SiN$_x$), a silicon oxide (SiO$_x$), and a silicon oxynitride (SiO$_x$N$_y$).

A second gate conductive layer including a first storage electrode 1153 may be positioned on the second gate insulating layer 142. The second gate conductive layer may have a single or multi-layered structure. The second gate conductive layer may include a metal material such as molybdenum (Mo), aluminum (Al), copper (Cu), and/or titanium (Ti). The first storage electrode 1153 overlaps the gate electrode 1151 to form a storage capacitor.

A first interlayer insulating layer 160 may be positioned on the second gate conductive layer including the first storage electrode 1153. The first interlayer insulating layer 160 may have a single or multi-layered structure. The first interlayer insulating layer 160 may include an inorganic insulating material or an organic insulating material.

A first data conductive layer including the source electrode 1173 and the drain electrode 1175 of the first pixel circuit part PC1 may be positioned on the first interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first interlayer insulating layer 160 may have an opening overlapping the source electrode 1173 of the first pixel circuit part PC1 and the first region 1131 of the semiconductor 1130. The source electrode 1173 of the first pixel circuit part PC1 may be connected to the first region 1131 of the semiconductor 1130 through the opening. The first interlayer insulating layer 160 may include an opening overlapping the drain electrode 1175 of the first pixel circuit part PC1 and the second region 1133 of the semiconductor 1130. The drain electrode 1175 of the first pixel circuit part PC1 may be connected to the second region 1133 of the semiconductor 1130 through the opening.

A first passivation layer 180 may be positioned on the first data conductive layer including the source electrode 1173 and the drain electrode 1175 of the first pixel circuit part PC1. The first passivation layer 180 may include an inorganic insulating material such as a silicon nitride (SiN$_x$), a silicon oxide (SiO$_x$), or a silicon oxynitride (SiON), and/or an organic insulating material such as a polyimide, an acrylic polymer, or a siloxane polymer.

A second data conductive layer including a connection electrode 510 of the first pixel circuit part PC1 may be positioned on the first passivation layer 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first passivation layer 180 may have an opening overlapping the drain electrode 1175 of the first pixel circuit part PC1. The connection electrode 510 of the first pixel circuit part PC1 may be connected to the drain electrode 1175 through the opening.

A second passivation layer 182 and a third passivation layer 184 may be positioned on the second data conductive layer including the connection electrode 510 of the first pixel circuit part PC1. The second passivation layer 182 and the third passivation layer 184 may each include a general purpose polymer such as poly(methyl methacrylate) (PMMA) or polystyrene (PS), a polymer derivative having a phenolic group, or an organic insulating material such as an acrylic polymer, an imide polymer, a polyimide, an acrylic polymer, or a siloxane polymer.

The first light-emitting device ED1 connected to the first pixel circuit part PC1 may be positioned on the third passivation layer 184. The first light-emitting device ED1 may include a pixel electrode 1191, an emission layer 1370, and a common electrode 270.

The pixel electrode 1191 of the first light-emitting device ED1 may be positioned on the third passivation layer 184. The third passivation layer 184 may have an opening 1181 overlapping the pixel electrode 1191 of the first light-emitting device ED1 and the connection electrode 510 of the first pixel circuit part PC1. The opening 1181 may also be formed in the second passivation layer 182. The pixel electrode 1191 of the first light-emitting device ED1 may be connected to the connection electrode 510 of the first pixel circuit part PC1 through the opening 1181. Accordingly, the pixel electrode 1191 of the first light-emitting device ED1 may be connected to the drain electrode 1175 of the first pixel circuit part PC1 through the connection electrode 510.

A partition wall 350 may be positioned on the pixel electrode 1191 of the first light-emitting device ED1. A pixel opening 1351 may be formed in the partition wall 350, and the pixel opening 1351 of the partition wall 350 may overlap the pixel electrode 1191.

The emission layer 1370 of the first light-emitting device ED1 may be positioned in the pixel opening 1351 of the partition wall 350. The emission layer 1370 may overlap the pixel electrode 1191.

A common electrode 270 may be positioned on the emission layer 1370 and the partition wall 350.

The first light-emitting device ED1 emits light around a region where the pixel electrode 1191, the emission layer 1370, and the common electrode 270 overlap each other, and the emission area of the first light-emitting device ED1 may overlap the first pixel circuit part PC1 connected thereto.

In this case, each first light-emitting device ED1 may display at least one of a first color, a second color, and a third color. For example, the first light-emitting device ED1 may display red, green, or blue.

The emission area of the second light-emitting device ED2 of the display device according to an embodiment may or may not overlap the second pixel circuit part PC2 connected to the second light-emitting device ED2. Some of the second light-emitting devices ED2 may overlap the second pixel circuit part PC2 connected to the second light-emitting devices ED2. Others of the second light-emitting devices ED2 may not overlap the second pixel circuit part PC2, but may instead overlap the driving circuit part DR and/or a signal transfer wire STW.

The second pixel circuit part PC2 may include a semiconductor 2130, a gate electrode 2151, a source electrode 2173, and a drain electrode 2175 positioned on the second display area DA2 of the substrate 110. The driving circuit part DR may include a semiconductor 3130, a gate electrode 3151, a source electrode 3173, and a drain electrode 3175 positioned on the second display area DA2 of the substrate 110.

The buffer layer 111 may be positioned on the substrate 110, and the semiconductor 2130 of the second pixel circuit part PC2 and the semiconductor 3130 of the driving circuit part DR may be positioned on the buffer layer 111. The semiconductor 2130 of the second pixel circuit part PC2 and the semiconductor 3130 of the driving circuit part DR may be positioned in a semiconductor layer. The semiconductor 2130 of the second pixel circuit part PC2 may include a first region 2131, a channel 2132, and a second region 2133. The semiconductor 2130 of the second pixel circuit part PC2 and the semiconductor 3130 of the driving circuit part DR may each include a semiconductor material such as amorphous silicon, polycrystalline silicon, or an oxide semiconductor. The second pixel circuit part PC2 and the driving circuit part DR may each include transistors, and in this case, some of the transistors may include a semiconductor made of polycrystalline silicon, and other transistors may include a semiconductor made of an oxide semiconductor. In this case, the semiconductor made of polycrystalline silicon and the oxide semiconductor may be positioned on different layers.

A first gate insulating layer 141 may be positioned on the semiconductor 2130 of the second pixel circuit part PC2 and the semiconductor 3130 of the driving circuit part DR, and a gate electrode 2151 of the second pixel circuit part PC2 and a gate electrode 3151 of the driving circuit part DR may be positioned on the first gate insulating layer 141. The gate electrode 2151 of the second pixel circuit part PC2 and the gate electrode 3151 of the driving circuit part DR may be positioned on the first gate conductive layer. The gate electrode 2151 of the second pixel circuit part PC2 may overlap the channel 2132 of the semiconductor 2130.

A second gate insulating layer 142 may be positioned on the gate electrode 2151 of the second pixel circuit part PC2 and the gate electrode 3151 of the driving circuit part DR, and a first storage electrode 2153 of the second pixel circuit part PC2 and a first storage electrode 3153 of the driving circuit part DR may be positioned on the second gate insulating layer 142. The first storage electrode 2153 of the second pixel circuit part PC2 may overlap the gate electrode 2151 of the second pixel circuit part PC2. The first storage electrode 3153 of the driving circuit part DR may overlap the gate electrode 3151 of the driving circuit part DR.

The first interlayer insulating layer 160 may be positioned on the first storage electrode 2153 of the second pixel circuit part PC2 and the first storage electrode 3153 of the driving circuit part DR. The source electrode 2173 and the drain electrode 2175 of the second pixel circuit part PC2 and the source electrode 3173 and the drain electrode 3175 of the driving circuit part DR may be positioned on the first interlayer insulating layer 160. The source electrode 2173 and the drain electrode 2175 of the second pixel circuit part PC2 and the source electrode 3173 and the drain electrode 3175 of the driving circuit part DR may be positioned on the first data conductive layer.

The first interlayer insulating layer 160 may have an opening overlapping the source electrode 2173 of the second pixel circuit part PC2 and the first region 2131 of the semiconductor 2130. The source electrode 2173 of the second pixel circuit part PC2 may be connected to the first region 2131 of the semiconductor 2130 through the opening. The first interlayer insulating layer 160 may include an opening overlapping the drain electrode 2175 of the second pixel circuit part PC2 and the second region 2133 of the semiconductor 2130. The drain electrode 2175 of the second pixel circuit part PC2 may be connected to the second region 2133 of the semiconductor 2130 through the opening. Similarly, the source electrode 3173 of the driving circuit part DR may be connected to the first region of the semiconductor 3130, and the drain electrode 3175 may be connected to the second region of the semiconductor 3130.

A first passivation layer 180 may be positioned on the source electrode 2173 and the drain electrode 2175 of the second pixel circuit part PC2, and the source electrode 3173 and the drain electrode 3175 of the driving circuit part DR.

A connection electrode 520 of the second pixel circuit part PC2 may be positioned on the first passivation layer 180. The connection electrode 520 of the second pixel circuit part PC2 may be positioned in the second data conductive layer. The first passivation layer 180 may have an opening overlapping the drain electrode 2175 of the second pixel circuit part PC2. The connection electrode 520 of the second pixel circuit part PC2 may be connected to the drain electrode 2175 through the opening.

The second data conductive layer may further include a signal transfer wire STW. The signal transmission wire STW may be positioned on the first passivation layer 180, and may overlap the second light-emitting device ED2. The signal transfer wire STW may also overlap the driving circuit part DR. In this case, the signal transfer wire STW may be positioned between the driving circuit part DR and the second light-emitting device ED2.

The signal transfer wire STW may include a gate voltage transfer wire 910, a first initialization voltage transfer wire 920, and a second initialization voltage transfer wire 930.

However, the disclosure is not limited thereto, and the signal transfer wire STW may include various other wires. The gate voltage transfer wiring 910 may be connected to a scan driver, and may transfer a high gate voltage or a low gate voltage. The first initialization voltage transfer wire 920 may transfer a first initialization voltage. The second initialization voltage transfer wire 930 may transfer a second initialization voltage. The signal transfer wire STW may further include a driving voltage supply line, a common voltage supply line, and the like. The signal transfer wire STW may transfer a constant voltage.

The signal transfer wire STW may not be formed as a single wire, but may include subwires. The subwires may be connected to each other by a bridge wire. For example, the bridge wire extends from the subwires.

The gate voltage transfer wire 910 may include a first subwire 911 and a second subwire 912. The gate voltage transfer wire 910 may further include a bridge wire (not illustrated) extending from the first subwire 911 and the second subwire 912. The first subwire 911 and the second subwire 912 of the gate voltage transfer wire 910 may be connected to each other by the bridge wire.

The first initialization voltage transfer wire 920 may include a first subwire 921 and a second subwire 922. The first initialization voltage transfer wire 920 may further include a bridge wire (not illustrated) extending from the first subwire 921 and the second subwire 922. The first subwire 921 and the second subwire 922 of the first initialization voltage transfer wire 920 may be connected to each other by the bridge wire.

The second initialization voltage transfer wire 930 may include a first subwire 931 and a second subwire 932. The second initialization voltage transfer wire 930 may further include a bridge wire (not illustrated) extending from the first subwire 931 and the second subwire 932. The first subwire 931 and the second subwire 932 of the first initialization voltage transfer wire 930 may be connected to each other by the bridge wire.

Hereinafter, a planar shape of the signal transfer wire STW will be described with further reference to FIG. 4.

Figure 4:
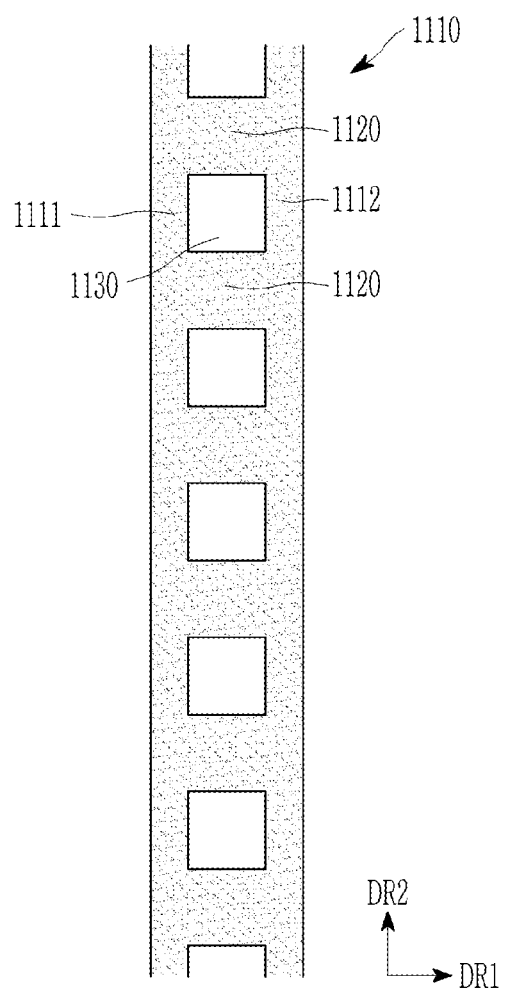
FIG. 4 illustrates a signal transfer wire of a display device according to an embodiment.

FIG. 4 is a schematic plan view illustrating a signal transfer wire of a display device according to an embodiment. FIG. 4 illustrates the planar shape of any one of the signal transfer wires.

As shown in FIG. 4, a signal transfer wire 1110 includes a first subwire 1111 and a second subwire 1112. The first subwire 1111 and the second subwire 1112 may extend in directions that are parallel to each other. For example, the first subwire 1111 and the second subwire 1112 may extend in the second direction DR2. The first subwire 1111 and the second subwire 1112 are positioned to be spaced apart from each other at an interval. The signal transfer wire 1110 may further include a bridge wire 1120 extending from the first subwire 1111 and the second subwire 1112. The bridge wire 1120 may be positioned between the first subwire 1111 and the second subwire 1112. The first subwire 1111 and the second subwire 1112 may be connected by the bridge wire 1120. The bridge wire 1120 may be extended in the first direction DR1. The first direction DR1 may be perpendicular to the second direction DR2. For example, the bridge wire 1120 may extend in a direction that is perpendicular to the first subwire 1111 and the second subwire 1112. The signal transfer wire 1110 may include bridge wires 1120. The bridge wires 1120 may extend in directions that are parallel to each other.

The signal transfer wire 1110 may have an opening 1130 surrounded by the first subwire 1111, the second subwire 1112, and the bridge wire 1120. The signal transfer wire 1110 may have openings 1130, and the bridge wire 1120 may be positioned between the openings 1130. The openings 1130 are positioned at an interval in the second direction DR2. In an embodiment, the openings 1130 are spaced apart from each other at a regular interval. In another embodiment, the openings 1130 are spaced apart from each other at a different interval.

A width of the bridge wire 1120 in the first direction DR1 may be substantially a same as that of the openings 1130 in the first direction DR1. The width of the bridge wire 1120 in the first direction DR1 and the width of the openings 1130 in the first direction DR1 may indicate a distance between the first subwire 1111 and the second subwire 1112.

A width of the bridge wire 1120 in the second direction DR2 may be substantially the same as that of the openings 1130 in the second direction DR2. The width of the bridge wire 1120 in the first direction DR1 may be substantially the same as that of the bridge wire 1120 in the second direction DR2. The width of the openings 1130 in the first direction DR1 may be substantially the same as that of the openings 1130 in the second direction DR2. In this case, a planar shape of the openings 1130 may be substantially square. The width of the openings 1130 may be greater than or equal to about 2.5 μm and less than or equal to about 15 μm.

Shapes of the first subwire 1111, the second subwire 1112, the bridge wire 1120, and the openings 1130 of the signal transfer wire 1110 are not limited thereto, and may be variously changed. For example, the planar shape of the openings 1130 may be formed to have a polygonal, circular, elliptical shape, or the like. The openings 1130 may be periodically or non-periodically positioned. Some of the openings 1130 may be periodically positioned, and others of the openings may be aperiodically positioned.

Hereinafter, various shapes of the signal transfer wire according to an embodiment will be described with reference to FIGS. 5 to 12.

FIGS. 5 to 12 illustrate schematic plan views illustrating a signal transfer wire of a display device according to an embodiment.

Figure 5:
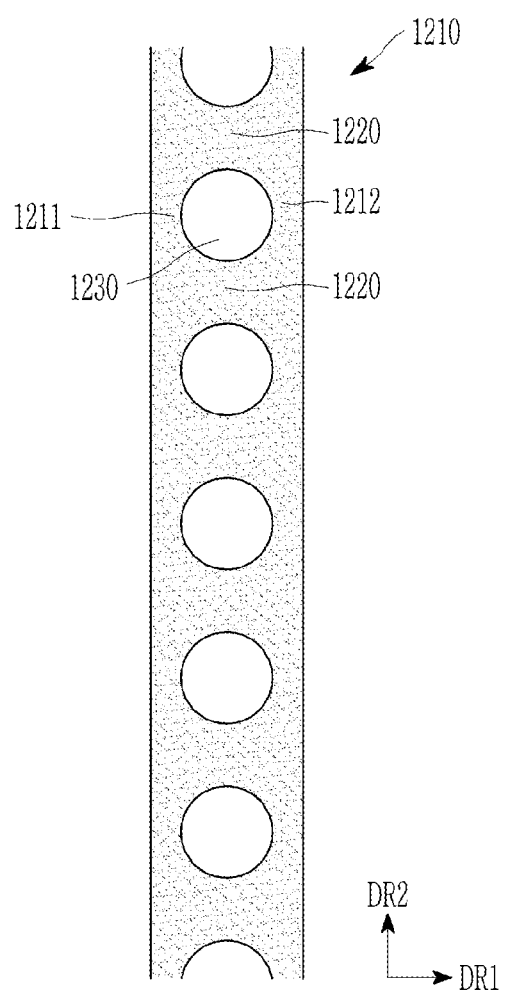
FIG. 5 to FIG. 12 illustrate a signal transfer wire of a display device according to an embodiment.

As illustrated in FIG. 5, a signal transfer wire 1210 according to an embodiment includes a first subwire 1211 and a second subwire 1212 spaced apart from each other. The signal transfer wire 1210 may further include a bridge wire 1220 extending from the first subwire 1211 and the second subwire 1212. The first subwire 1211 and the second subwire 1212 may extend substantially in the second direction DR2, and the bridge wire 1220 may extend substantially in the first direction DR1. The signal transfer wire 1210 may include bridge wires 1220.

The signal transfer wire 1210 may have an opening 1230 surrounded by the first subwire 1211, the second subwire 1212, and the bridge wire 1220. The signal transfer wire 1210 may have openings 1230, and the bridge wire 1220 may be positioned between the openings 1230. A planar shape of the openings 1230 may be substantially square.

Figure 6:
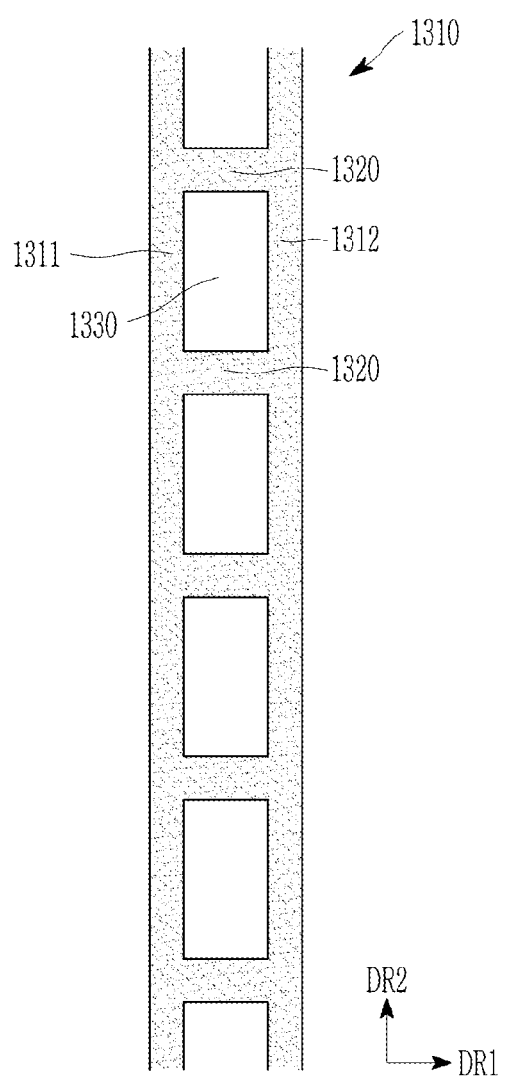

As illustrated in FIG. 6, a signal transfer wire 1310 according to an embodiment includes a first subwire 1311 and a second subwire 1312 spaced apart from each other. Further, the signal transfer wire 1310 may further include bridge wires 1320 extending from the first subwire 1311 and the second subwire 1312. The signal transfer wire 1310 may have an opening 1330 surrounded by the first subwire 1311, the second subwire 1312, and the bridge wire 1320. A planar shape of the openings 1330 may be substantially rectangular.

The openings 1330 may include two sides parallel to the first direction DR1 and two sides parallel to the second direction DR2. In this case, a length of the two sides parallel to the second direction DR2 may be greater than that of the two sides parallel to the first direction DR1. A length of a side of the openings 1330 parallel to the second direction DR2 may be greater than a distance between two adjacent openings 1330. For example, the length of the side, parallel to the second direction DR2, of the openings 1330 may be greater than that of the bridge wire 1320 in the second direction DR2.

Figure 7:
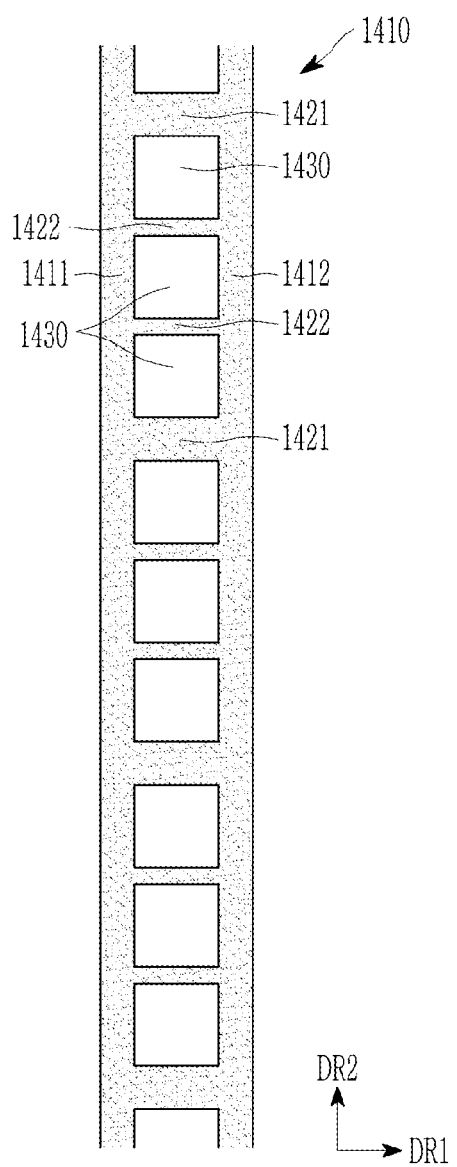

As illustrated in FIG. 7, a signal transfer wire 1410 according to an embodiment includes a first subwire 1411 and a second subwire 1412 spaced apart from each other. Further, the signal transfer wire 1410 may further include bridge wires 1420 extending from the first subwire 1411 and the second subwire 1412. The bridge wires 1420 may include a first bridge wire 1421 and a second bridge wire 1422. The signal transfer wire 1410 may have an opening 1430 surrounded by the first subwire 1411, the second subwire 1412, and the bridge wires 1420. A planar shape of the openings 1430 may be substantially square.

Three openings 1430 may constitute a set. However, a number of openings 1430 constituting a set is not limited thereto, and may be variously changed. The first bridge wire 1421 may be positioned between sets of openings 1430 and the second bridge wire 1422 may be positioned between three openings 1430 positioned within a set. A width of the first bridge wire 1421 in the second direction DR2 may be greater than that of the second bridge wire 1422 in the second direction DR2. However, the disclosure is not limited thereto, and the width of the first bridge wire 1421 in the second direction DR2 may be equal to or smaller than that of the second bridge wire 1422 in the second direction DR2.

Figure 8:
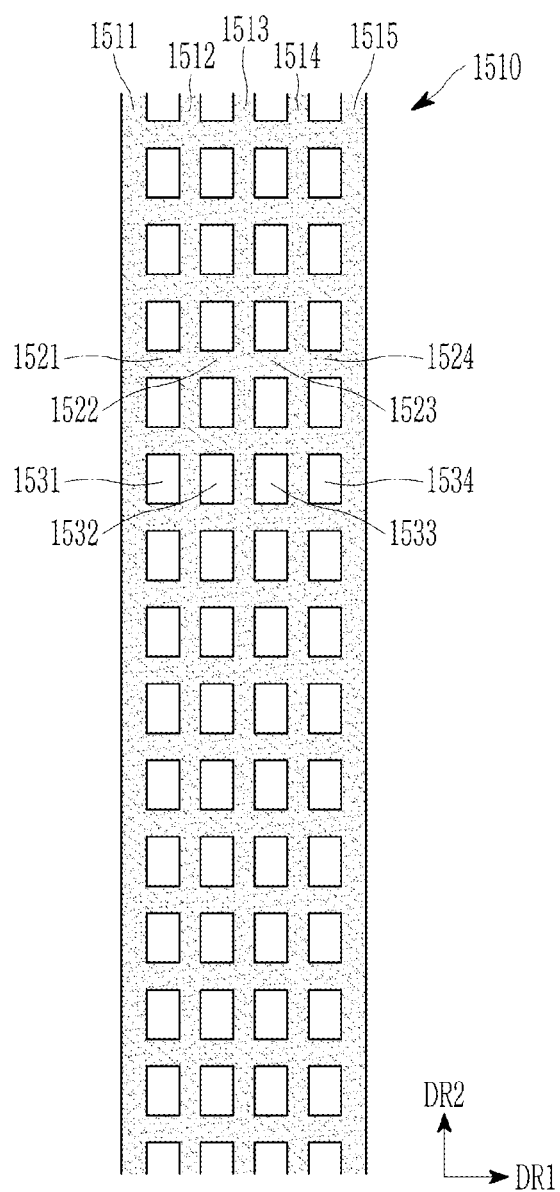

As illustrated in FIG. 8, a signal transfer wire 1510 according to an embodiment includes a first subwire 1511, a second subwire 1512, a third subwire 1513, a fourth subwire 1514, and a fifth subwire 1515 which are spaced apart from each other. The first subwire 1511, the second subwire 1512, the third subwire 1513, the fourth subwire 1514, and the fifth subwire 1515 may extend substantially in the second direction DR2.

The signal transfer wire 1510 may further include a first bridge wire 1521, a second bridge wire 1522, a third bridge wire 1523, and a fourth bridge wire 1524. The first bridge wire 1521, the second bridge wire 1522, the third bridge wire 1523, and the fourth bridge wire 1524 may extend substantially in the first direction DR1. The first bridge wire 1521, the second bridge wire 1522, the third bridge wire 1523, and the fourth bridge wire 1524 may be positioned on a same extension. The first bridge wire 1521 extends from the first subwire 1511 and the second subwire 1512. The second bridge wire 1522 extends from the second subwire 1512 and the third subwire 1513. Third bridge wire 1523 extends from third subwire 1513 and the fourth subwire 1514. The fourth bridge wire 1524 extends from the fourth subwire 1514 and the fifth subwire 1515.

The signal transfer wire 1510 may further include a first opening 1531, a second opening 1532, a third opening 1533, and a fourth opening 1534. The first opening 1531 is surrounded by the first subwire 1511, the second subwire 1512, and the first bridge wire 1521. The first openings 1531 are positioned at intervals in the second direction DR2. The first bridge wire 1521 may be positioned between adjacent first openings 1531. The second opening 1532 is surrounded by the second subwire 1512, the third subwire 1513, and the second bridge wire 1522. The second openings 1532 are positioned at intervals in the second direction DR2. The second bridge wire 1522 may be positioned between adjacent second openings 1532. The third opening 1533 is surrounded by the third subwire 1513, the fourth subwire 1514, and the third bridge wiring 1523. The third openings 1533 are positioned at intervals in the second direction DR2. The third bridge wire 1523 may be positioned between adjacent third openings 1533. The fourth opening 1534 is surrounded by the fourth subwire 1514, the fifth subwire 1515, and the fourth bridge wire 1524. The fourth openings 1534 are positioned at intervals in the second direction DR2. The fourth bridge wire 1524 may be positioned between adjacent fourth openings 1534.

Although it has been described above that the signal transfer wire 1510 according to an embodiment includes five subwires and a bridge wire connecting them, the disclosure is not limited thereto. A number of subwires and a number of bridge wires constituting the signal transfer wire may be variously changed. Although it has been described that different bridge wires are positioned on a same extension, the disclosure is not limited thereto, and the different bridge wires may be positioned to cross each other.

Figure 9:
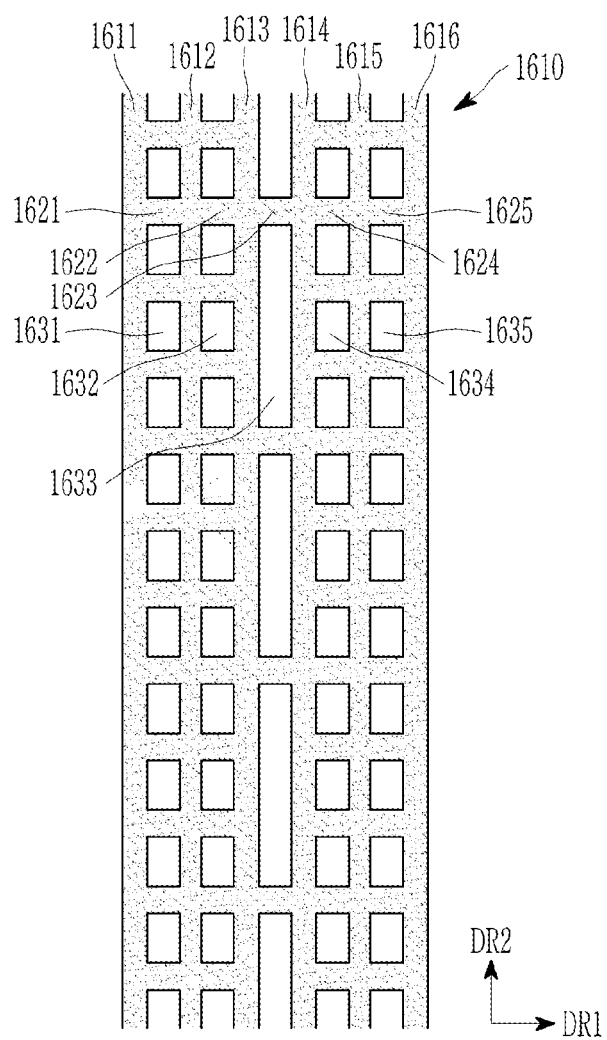

As illustrated in FIG. 9, a signal transfer wire 1610 according to an embodiment includes a first subwire 1611, a second subwire 1612, a third subwire 1613, a fourth subwire 1614, a fifth subwire 1615, and a sixth subwire 1616 which are spaced apart from each other. The signal transfer wire 1610 may further include a first bridge wire 1621, a second bridge wire 1622, a third bridge wire 1623, a fourth bridge wire 1624, and a fifth bridge wire 1625. The first bridge wire 1621 extends from the first subwire 1611 and the second subwire 1612. The second bridge wire 1622 extends from the second subwire 1612 and the third subwire 1613. The third bridge wire 1623 extends from the third subwire 1613 and the fourth subwire 1614. The fourth bridge wire 1624 extends from the fourth subwire 1614 and the fifth subwire 1615. The fifth bridge wire 1625 extends from the fifth subwire 1615 and the sixth subwire 1616.

The signal transfer wire 1610 may further include a first opening 1631, a second opening 1632, a third opening 1633, a fourth opening 1634, and a fifth opening 1635. The first opening 1631 is surrounded by the first subwire 1611, the second subwire 1612, and the first bridge wire 1621. The second opening 1632 is surrounded by the second subwire 1612, the third subwire 1613, and the second bridge wire 1622. The third opening 1633 is surrounded by the third subwire 1613, the fourth subwire 1614, and the third bridge wiring 1623. The fourth opening 1634 is surrounded by the fourth subwire 1614, the fifth subwire 1615, and the fourth bridge wire 1624. The fifth opening 1635 is surrounded by the fifth subwire 1615, the sixth subwire 1616, and the fifth bridge wire 1625.

The first opening 1631, the second opening 1632, the third opening 1633, the fourth opening 1634, and the fifth opening 1635 may have a selectable size. At least one of the first opening 1631, the second opening 1632, the third opening 1633, the fourth opening 1634, and the fifth opening 1635 may have a different size. For example, a size of the third opening 1633 may be different from sizes of the first opening 1631, the second opening 1632, the fourth opening 1634, and the fifth opening 1635. The sizes of the first opening 1631, the second opening 1632, the fourth opening 1634, and the fifth opening 1635 may be substantially the same. The size of the third opening 1633 may be greater than the sizes of the first opening 1631, the second opening 1632, the fourth opening 1634, and the fifth opening 1635. For example, the size of the third opening 1633 may reach about three times the sizes of the first opening 1631, the second opening 1632, the fourth opening 1634, and the fifth opening 1635. In this case, the first opening 1631, the second opening 1632, the fourth opening 1634, and the fifth opening 1635 may be positioned every pixel row, and the third opening 1633 may be positioned every three pixel rows. However, this is merely an example, and the sizes of the first opening 1631, the second opening 1632, the third opening 1633, the fourth opening 1634, and the fifth opening 1635 may be variously changed.

Figure 10:
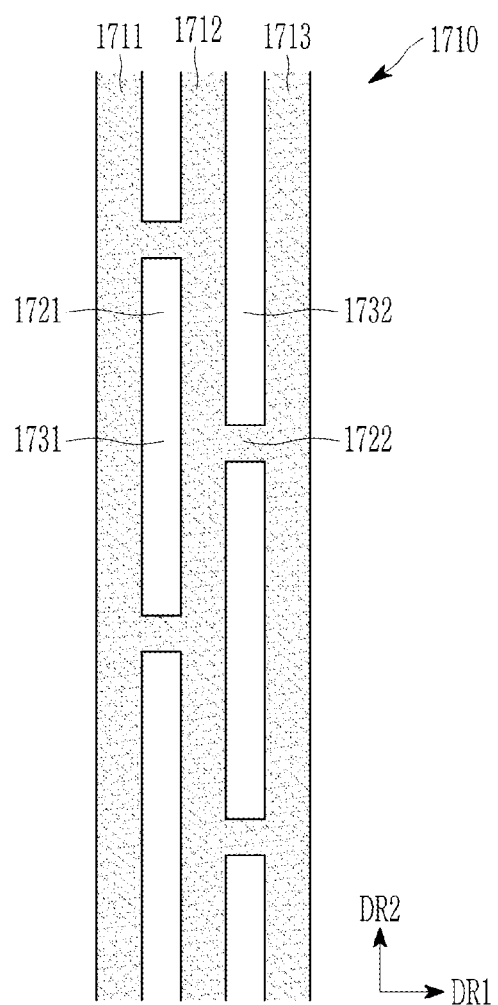

As illustrated in FIG. 10, a signal transfer wire 1710 according to an embodiment includes a first subwire 1711, a second subwire 1712, and a third subwire 1713 spaced apart from each other. The signal transfer wire 1710 may further include a first bridge wire 1721 and a second bridge wire 1722. The first bridge wire 1721 extends from the first subwire 1711 and the second subwire 1712. The second bridge wire 1722 extends from the second subwire 1712 and the third subwire 1713. The first bridge wire 1721 and the second bridge wire 1722 may not be positioned on a same extension. The first bridge wire 1721 and the second bridge wire 1722 are positioned to cross each other.

The signal transfer wire 1710 may further include a first opening 1731 and a second opening 1732. The first opening 1731 is surrounded by the first subwire 1711, the second subwire 1712, and the first bridge wire 1721. The second opening 1732 is surrounded by the second subwire 1712, the third subwire 1713, and the second bridge wire 1722. The first opening 1731 and the second opening 1732 are positioned to cross each other.

Figure 11:
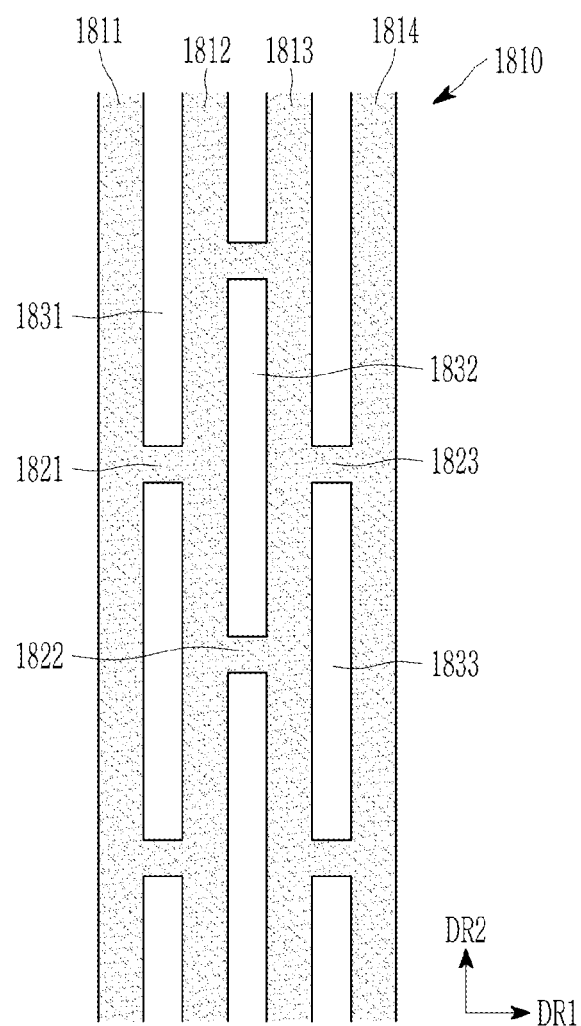

As illustrated in FIG. 11, a signal transfer wire 1810 according to an embodiment includes a first subwire 1811, a second subwire 1812, a third subwire 1813, and a fourth subwire 1814 which are spaced apart from each other. The signal transfer wire 1810 may further include a first bridge wire 1821, a second bridge wire 1822, and a third bridge wire 1823. The first bridge wire 1821 extends from the first subwire 1811 and the second subwire 1812. The second bridge wire 1822 extends from the second subwire 1812 and the third subwire 1813. The third bridge wire 1823 extends from the third subwire 1813 and the fourth subwire 1814. The first bridge wire 1821 and the second bridge wire 1822 may not be positioned on a same extension. The first bridge wire 1821 and the second bridge wire 1822 are positioned to cross each other. The second bridge wire 1822 and the third bridge wire 1823 may not be positioned on a same extension. The second bridge wire 1822 and the second bridge wire 1823 are positioned to cross each other. The first bridge wire 1821 and the third bridge wire 1822 may not be positioned on a same extension.

The signal transfer wire 1810 may further include a first opening 1831, a second opening 1832, and a third opening 1833. The first opening 1831 is surrounded by the first subwire 1811, the second subwire 1812, and the first bridge wire 1821. The second opening 1832 is surrounded by the second subwire 1812, the third subwire 1813, and the second bridge wire 1822. The third opening 1833 is surrounded by the third subwire 1813, the fourth subwire 1814, and the third bridge wiring 1823. The first opening 1831 and the second opening 1832 are positioned to cross each other. The second opening 1832 and the third opening 1833 are positioned to cross each other. The first opening 1831 and the third opening 1833 may be positioned alongside each other.

Figure 12:
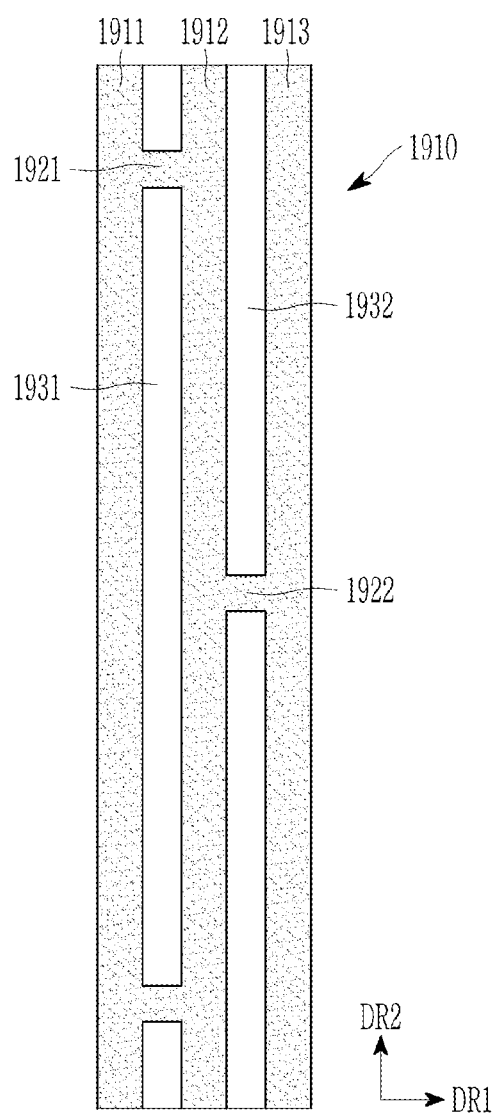

As illustrated in FIG. 12, a signal transfer wire 1910 according to an embodiment includes a first subwire 1911, a second subwire 1912, and a third subwire 1913 spaced apart from each other. The signal transfer wire 1910 may further include a first bridge wire 1921 and a second bridge wire 1922. The signal transfer wire 1910 may further include a first opening 1931 and a second opening 1932.

Sizes of the first opening 1931 and the second opening 1932 in FIG. 12 may be relatively larger than those of the first opening 1731 and the second opening 1732 in FIG. 10. For example, in FIG. 10, each of the first opening 1731 and the second opening 1732 may have a size corresponding to two pixels. In FIG. 12, the first opening 1931 and the second opening 1932 may each be formed to have a size corresponding to four pixels. Accordingly, a distance between adjacent first bridge wires 1921 in FIG. 12 may be relatively greater than the distance between the adjacent first bridge wires 1721 in FIG. 10. A distance between adjacent second bridge wires 1922 in FIG. 12 may be relatively greater than the distance between the adjacent second bridge wires 1722 in FIG. 10.

A size of the openings constituting the signal transfer wire 1910 may be variously changed. Although FIG. 12 illustrates that the sizes of the openings are substantially the same, the disclosure is not limited thereto, and the openings may have different sizes.

Referring again to FIG. 3, a second passivation layer 182 may be positioned on the connection electrode 520 of the second pixel circuit part PC2 and the signal transfer wire STW.

An extension wire 600 may be positioned on the second passivation layer 182. The second passivation layer 182 may have an opening overlapping the extension wire 600 and the connection electrode 520 of the second pixel circuit part PC2. The extension wire 600 may be connected to the connection electrode 520 of the second pixel circuit part PC2 through the opening. The extension wire 600 may be positioned only in the second display area DA2 and not in the first display area DA1.

A third passivation layer 184 may be positioned on the extension wire 600. Second light-emitting devices ED2 connected to the second pixel circuit part PC2 may be positioned on the third passivation layer 184. For example, the second pixel circuit part PC2 may be connected to two second light-emitting devices ED2. However, a number of the second light-emitting devices ED2 connected to the second pixel circuit part PC2 is not limited thereto. The second pixel circuit part PC2 may be connected to a second light-emitting device ED2 or may be connected to three or more second light-emitting devices ED2. The first light-emitting devices ED2 may each include a pixel electrode 2191, an emission layer 2370, and a common electrode 270.

The pixel electrode 2191 of each of the second light-emitting devices ED2 may be positioned on the third passivation layer 184. The pixel electrode 2191 of the second light-emitting device ED2 and the pixel electrode 1191 of the first light-emitting device ED1 may be positioned on a same layer. The third passivation layer 184 may have an opening 2181 overlapping the extension wire 600 and the pixel electrode 2191 of the second light-emitting device ED2. The pixel electrode 2191 of each second light-emitting device ED2 may be connected to the extension wire 600 through the opening 2181. The extension wire 600 may be connected to the connection electrode 520 of the second pixel circuit part PC2. Accordingly, the extension wire 600 may connect the second pixel circuit part PC2 and the second light-emitting devices ED2. At least some of the second light-emitting devices ED2 may not overlap the second pixel circuit part PC2 connected to the second light-emitting devices ED2, but may be far apart therefrom.

The extension wire 600 may connect the second pixel circuit part PC2 and the second light-emitting devices ED2 spaced apart from each other.

Although it has been described above that the second pixel circuit part PC2 and the second light-emitting devices ED2 are connected by the extension wire 600, the disclosure is not limited thereto. In some embodiments, the extension wire 600 may be omitted, and the pixel electrode 2191 of each second light-emitting device ED2 may extend to be connected to the second pixel circuit part PC2 that is far away. In this case, the pixel electrode 2191 of each second light-emitting device ED2 may be formed to extend long, and may be bypassed so as to not collide with an adjacent pixel and may be connected to a second pixel circuit part PC2.

A partition wall 350 may be positioned on the pixel electrode 2191 of the second light-emitting device ED2. A pixel opening 2351 may be formed in the partition wall 350, and the pixel opening 2351 of the partition wall 350 may overlap the pixel electrode 2191.

The emission layer 2370 of the second light-emitting device ED2 may be positioned in the pixel opening 2351 of the partition wall 350. The emission layer 2370 may overlap the pixel electrode 2191.

A common electrode 270 may be positioned on the emission layer 2370 and the partition wall 350. The common electrode 270 of the second light-emitting device ED2 and the common electrode 270 of the first light-emitting device ED1 may be integral with each other, and may be entirely positioned in most regions on the substrate 110.

The second light-emitting device ED2 emits light around a region where the pixel electrode 2191, the emission layer 2370, and the common electrode 270 overlap each other, and the emission area of the second light-emitting device ED2 may or may not overlap the second pixel circuit part PC2 connected thereto.

In the display device according to an embodiment, the second light-emitting device ED2 may expand an area in which an image is displayed by being positioned not only in a region where the second pixel circuit part PC2 is positioned but also in a region where the driving circuit part DR is positioned. Accordingly, pixel density in the second display area DA2 may be relatively lower than that in the first display area DA1. In this case, a size of the second light-emitting device ED2 may be increased to increase luminance of the second light-emitting device ED2 and to compensate for the decreased pixel density. Accordingly, each device such as a storage capacitor included in the second pixel circuit part PC2 may be formed to have a large size in order to supply more current to the second light-emitting device ED2. For example, an area occupied by the second pixel circuit part PC2 may be increased. For example, the area of the second pixel circuit part PC2 may be approximately twice the area of the first pixel circuit part PC1. In this case, an area of the second light-emitting device ED2 may be about twice that of the first light-emitting device ED1. However, this is merely an example, and areas of the second pixel circuit part PC2 and the second light-emitting device ED2 may be set in various ways.

Hereinafter, a display device according to a comparative example and a display device according to an example will be described with reference to FIGS. 13 to 16.

Figure 13:
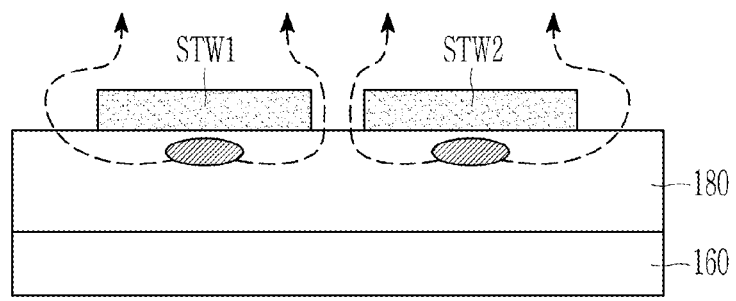
FIG. 13 and FIG. 14 each illustrate some layers of a display device according to an embodiment.
Figure 14:
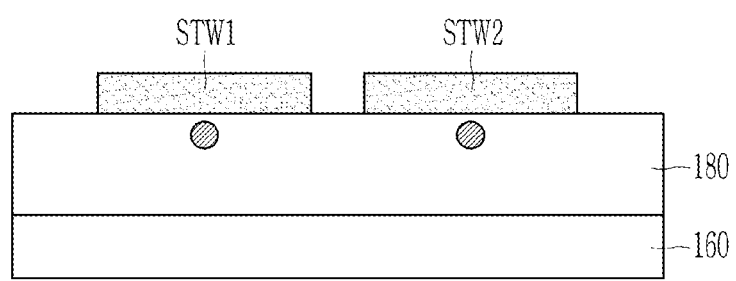
Figure 15:
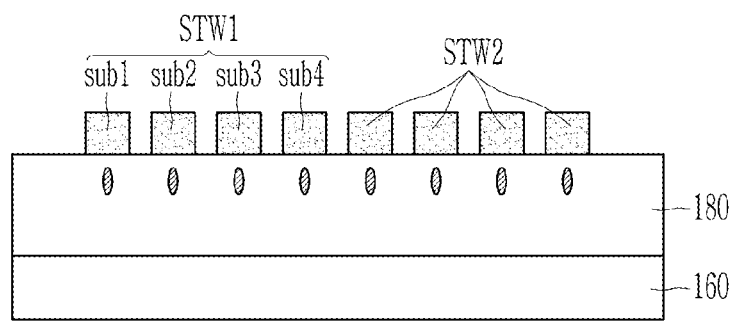
FIG. 15 and FIG. 16 each illustrate some layers of a display device according to an embodiment.
Figure 16:
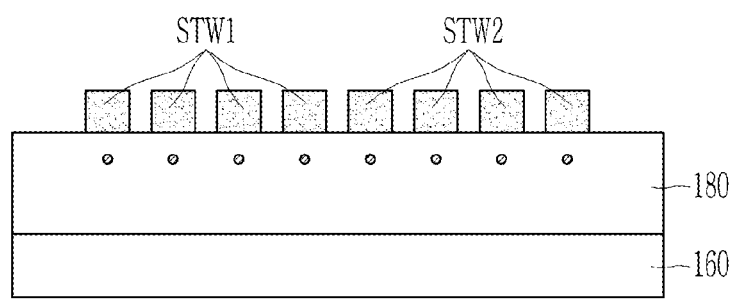

FIGS. 13 and 14 each illustrate some layers of a display device according to a comparative example, and FIGS. 15 and 16 each illustrate some layers of a display device according to an example.

As illustrated in FIG. 13, in the display device according to the comparative example, a first passivation layer 180 is positioned on the first interlayer insulating layer 160, and signal transfer wires STW1 and STW2 may be positioned on the first passivation layer 180. Each of the signal transfer wires STW1 and STW2 may be formed as a single wire.

The first passivation layer 180, which is an insulating layer positioned under the signal transfer wires STW1 and STW2, may be made of an organic material, and a gas may be generated inside the first passivation layer 180 during baking of the organic material. The generated gas may be discharged to the outside by moving to an upper surface of the first passivation layer 180. As illustrated in FIG. 14, a portion of the generated gas is blocked by the signal transfer wires STW1 and STW2 positioned on the first passivation layer 180 not to be discharged, and may remain in the first passivation layer 180. The gas remaining in the first passivation layer 180 may affect the electrodes, wires, light-emitting devices, etc. positioned on the first passivation layer 180, and may cause defects.

As illustrated in FIG. 15, in the display device according to the example, a first passivation layer 180 is positioned on the first interlayer insulating layer 160, and signal transfer wires STW1 and STW2 may be positioned on the first passivation layer 180. Each of the signal transfer wires STW1 and STW2 is not formed as a single wire, and includes subwires sub1, sub2, sub3, and sub4. The subwires sub1, sub2, sub3, and sub4 constituting each of the signal transfer wires STW1 and STW2 may be connected to each other by bridge wires. Each of the signal transfer wires STW1 and STW2 may have an opening surrounded by the subwires sub1, sub2, sub3, and sub4 and the bridge wires.

A sum of widths of the subwires sub1, sub2, sub3, and sub4 constituting each of the signal transfer wires STW1 and STW2 in FIG. 15 may correspond to a width of each of the signal transfer wires STW1 and STW2 in FIG. 13. For example, in FIG. 13, each of the signal transfer wires STW1 and STW2 may have a width of about 20 μm. In this case, in FIG. 15, each of the subwires sub1, sub2, sub3, and sub4 may have a width of about 5 μm.

The first passivation layer 180, which is an insulating layer positioned under the signal transfer wires STW1 and STW2, may be made of an organic material, and a gas may be generated inside the first passivation layer 180 during baking of the organic material. The generated gas may be discharged to the outside by moving to an upper surface of the first passivation layer 180. The generated gas may be discharged to the outside through a space between the signal transfer wires STW1 and STW2 and a space between the subwires sub1, sub2, sub3, and sub4 constituting each of the signal transfer wires STW1 and STW2. For example, the gas may be discharged to the outside through the openings of the signal transfer wires STW1 and STW2, and thus as illustrated in FIG. 16, it is hardly blocked by the signal transfer wires STW1 and STW2 positioned on the first passivation layer 180. Accordingly, an amount of gas remaining in the first passivation layer 180 may be relatively reduced compared to that in the display device according to the comparative example. Accordingly, characteristics of an electrode, a wire, a light-emitting device, etc. positioned on the first passivation layer 180 may be improved. For example, characteristics of the second light-emitting device positioned on the signal transfer wires STW1 and STW2 may be improved.

Although a transistor of each of the pixel circuit parts PC1 and PC2 has been described above, in reality, each of the pixel circuit parts PC1 and PC2 may include transistors.

Hereinafter, an example of a pixel of a display device according to an embodiment will be described with reference to FIG. 17.

Figure 17:
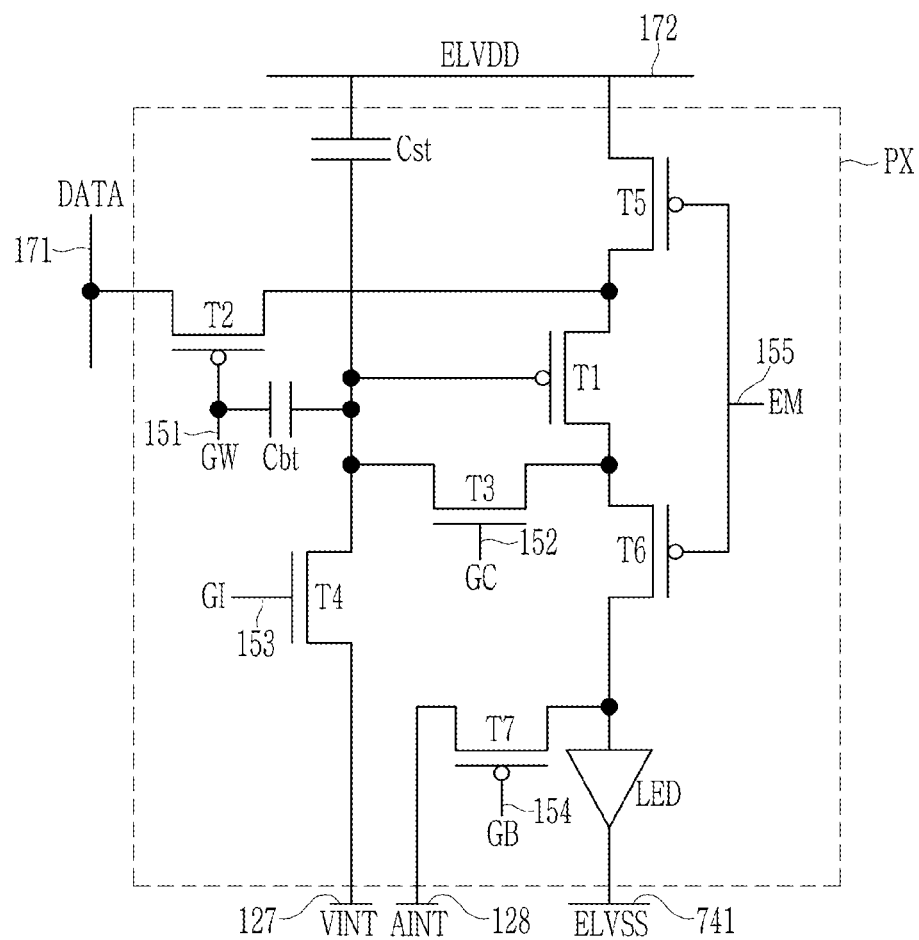
FIG. 17 illustrates a circuit diagram of a display device according to an embodiment.

FIG. 17 illustrates a schematic diagram of an equivalent circuit of a pixel of a display device according to an embodiment.

As illustrated in FIG. 17, according to the embodiment, a pixel PX of the display device includes transistors T1, T2, T3, T4, T5, T6, and T7, a storage capacitor Cst, a boost capacitor Cbt, and a light-emitting diode LED connected to various wires 127, 128, 151, 152, 153, 154, 155, 171, 172, and 741.

The wires 127, 128, 151, 152, 153, 154, 155, 171, 172, and 741 are connected to a pixel PX. The wires include a first initialization voltage line 127, a second initialization voltage line 128, a first scan signal line 151, a second scan signal line 152, an initialization control line 153, a bypass control line 154, an emission control line 155, a data line 171, a driving voltage line 172, and a common voltage line 741.

The first scan signal line 151 is connected to a scan driver (not illustrated) to transmit a first scan signal GW to the second transistor T2. A voltage having a polarity that is opposite to that of the voltage applied to the first scan signal line 151 may be applied to the second scan signal line 152 at a same timing as a signal of the first scan signal line 151. For example, in case that a negative voltage is applied to the first scan signal line 151, a positive voltage may be applied to the second scan signal line 152. The second scan signal line 152 transmits a second scan signal GC to the third transistor T3. The scan driver generating such a scan signal may be connected to a gate voltage transfer wire 910 (FIG. 3).

The initialization control line 153 transmits an initialization control signal GI to the fourth transistor T4. The bypass control line 154 transfers a bypass signal GB to the seventh transistor T7. The bypass control line 154 may be formed by a previous-stage first scan signal line 151. The emission control line 155 transmits an emission control signal EM to the fifth transistor T5 and the sixth transistor T6.

The data line 171 is a wire for transmitting a data voltage DATA generated by a data driver (not illustrated), and luminance of the organic light-emitting diode LED that emits light is changed depending on the data voltage DATA applied to the pixel PX.

The driving voltage line 172 applies a driving voltage ELVDD. The first initialization voltage line 127 transfers a first initialization voltage VINT, and the second initialization voltage line 128 transfers a second initialization voltage AINT. The common voltage line 741 applies a common voltage ELVSS to a cathode of the light-emitting diode LED. In the embodiment, voltages applied to the driving voltage line 172, the first and second initialization voltage lines 127 and 128, and the common voltage line 741 may be constant voltages, respectively. The first initialization voltage line 127 may be connected to the first initialization voltage transfer wire 920 (FIG. 3). The second initialization voltage line 128 may be connected to the second initialization voltage transfer wire 930 (FIG. 3).

Hereinafter, a structure and connection relationship of the transistors will be described in detail.

The driving transistor T1 may have a p-type transistor characteristic, and may include a polycrystalline semiconductor. It is a transistor that adjusts a level of a current outputted to an anode of the light-emitting device LED depending on the data voltage DATA applied to a gate electrode of the driving transistor T1. A brightness of the light-emitting diode LED may be adjusted depending on a magnitude of the driving current outputted to the anode of the light-emitting diode LED, and thus the brightness of the light-emitting diode LED may be adjusted depending on the data voltage DATA applied to the pixel PX. For this purpose, a first electrode of the driving transistor T1 is connected to the driving voltage line 172 via the fifth transistor T5 by being positioned to receive the driving voltage ELVDD. The first electrode of the driving transistor T1 is also connected to a second electrode of the second transistor T2 to receive a data voltage DATA. A second electrode of the driving transistor T1 is positioned to output a current toward the light-emitting diode LED, and is connected to the anode of the light-emitting diode LED via the sixth transistor T6. The second electrode of the driving transistor T1 transfers the data voltage DATA, applied to the first electrode, to the third transistor T3. The gate electrode of the driving transistor T1 is connected to a first electrode (hereinafter referred to as a "second storage electrode") of the storage capacitor Cst. Accordingly, the voltage of the gate electrode of the driving transistor T1 changes depending on a voltage stored in the storage capacitor Cst, and a driving current outputted by the driving transistor T1 changes accordingly. The storage capacitor Cst serves to maintain a voltage of the gate electrode of the driving transistor T1 to be constant during a frame.

The second transistor T2 may have a p-type transistor characteristic, and may include a polycrystalline semiconductor. The second transistor T2 is a transistor that receives the data voltage DATA into the pixel PX. A gate electrode of the second transistor T2 is connected to the first scan signal line 151 and a first electrode of the boost capacitor Cbt (hereinafter referred to as a "lower boost electrode"). A first electrode of the second transistor T2 is connected to the data line 171. A second electrode of the second transistor T2 is connected to the first electrode of the driving transistor T1. In case that the second transistor T2 is turned on by a negative voltage of the first scan signal GW transferred through the first scan signal line 151, the data voltage DATA transferred through the data line 171 is transferred to the first electrode of the driving transistor T1.

The third transistor T3 may have an n-type transistor characteristic, and may include an oxide semiconductor. The third transistor T3 electrically connects the second electrode of the driving transistor T1 and the gate electrode of the driving transistor T1. As a result, it is a transistor in which a compensation voltage obtained by changing the data voltage DATA by the driving transistor T1 is transferred to the second storage electrode of the storage capacitor Cst. A gate electrode of the third transistor T3 is connected to the second scan signal line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and a second electrode of the boost capacitor Cbt (hereinafter referred to as an "upper boost electrode"). The third transistor T3 is turned on by a positive voltage among the second scan signals GC received through the second scan signal line 152, to connect the gate electrode of the driving transistor T1 and the second electrode of the driving transistor T1, and to transfer the voltage, applied to the gate electrode of the driving transistor T1, to the second storage electrode of the storage capacitor Cst so that the voltage is stored in the storage capacitor Cst.

The four transistor T4 may have an n-type transistor characteristic, and may include an oxide semiconductor. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second storage electrode of the storage capacitor Cst, the gate electrode of the driving transistor T1, and the upper boost electrode via the second electrode of the third transistor T3. The fourth transistor T4 is turned on by the positive voltage of the initialization control signal GI transferred through the initialization control line 153, and in this case, the first initialization voltage VINT is transferred to the gate electrode of the driving transistor T1 and the second storage electrode of the storage capacitor Cst. Accordingly, a voltage of the gate electrode of the driving transistor T1 and the storage capacitor Cst are initialized.

The fifth transistor T5 may have a p-type transistor characteristic, and may include a polycrystalline semiconductor. The fifth transistor T5 serves to transfer the driving voltage ELVDD to the driving transistor T1. A gate electrode of the fifth transistor T5 is connected to the emission control line 155, a first electrode of the fifth transistor T5 is connected to the driving voltage line 172, and a second electrode of the fifth transistor T5 is connected to the first electrode of the driving transistor T1.

The sixth transistor T6 may have a p-type transistor characteristic, and may include a polycrystalline semiconductor. The sixth transistor T6 serves to transfer a driving current, outputted from the driving transistor T1, to the light-emitting diode LED. A gate electrode of the sixth transistor T6 is connected to the emission control line 155, a first electrode of the sixth transistor T6 is connected to the second electrode of the driving transistor T1, and a second electrode of the sixth transistor T6 is connected to the anode of the light-emitting element LED.

The seventh transistor T7 may have a p-type transistor characteristic, and may include a polycrystalline semiconductor. The seventh transistor T7 serves to initialize the anode of the light-emitting diode LED. A gate electrode of the seventh transistor T7 is connected to the bypass control line 154, a first electrode of the seventh transistor T7 is connected to the anode of the light-emitting element LED, and a second electrode of the seventh transistor T7 is connected to the second initialization voltage line 128. In case that the seventh transistor T7 is turned on by a negative voltage of the bypass signal GB, the second initialization voltage AINT is applied to the anode of the light-emitting diode LED to initialize the same.

It has been described that a pixel PX includes seven transistors T1 to T7, a storage capacitor Cst, and a boost capacitor Cbt, but the disclosure is not limited thereto, and a number of transistors, a number of capacitors, and their connection relationships may be variously changed.

In the embodiment, the driving transistor T1 may include a polycrystalline semiconductor. The third transistor T3 and the fourth transistor T4 may each include an oxide semiconductor. The second transistor T2, the fifth transistor T5, the sixth transistor T6, and the seventh transistor T7 may include a polycrystalline semiconductor. However, the disclosure is not limited thereto, and at least one of the second transistor T2, the fifth transistor T5, the sixth transistor T6, and the seventh transistor T7 may include an oxide semiconductor. All of the transistors may include a polycrystalline semiconductor.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
    a substrate including a first display area and a second display area;
    a first pixel circuit part disposed on the first display area of the substrate;
    a first light-emitting device connected to the first pixel circuit part;
    a second pixel circuit part disposed on the second display area of the substrate;
    a second light-emitting device connected to the second pixel circuit part; and
    a signal transfer wire that overlaps the second light-emitting device,
    wherein the signal transfer wire includes:
        a plurality of subwires spaced apart from each other, and
        a bridge wire extending from the plurality of subwires.

2. The display device of claim 1, wherein the signal transfer wire transfers a constant voltage.

3. The display device of claim 2, wherein the signal transfer wire includes at least one of a gate voltage transfer wire, a first initialization voltage transfer wire, and a second initialization voltage transfer wire.

4. The display device of claim 3, further comprising:
    a driving circuit part connected to the first pixel circuit part and the second pixel circuit part, the driving circuit part overlapping the second light-emitting device.

5. The display device of claim 4, wherein the signal transfer wire is positioned between the driving circuit part and the second light-emitting device.

6. The display device of claim 5, further comprising:
    a first passivation layer disposed between the signal transfer wire and the driving circuit part,
    wherein the first passivation layer includes an organic insulating material.

7. The display device of claim 4, wherein
    the driving circuit part includes a scan driver generating a scan signal, and
    the gate voltage transfer wire is connected to the scan driver.

8. The display device of claim 4, wherein
    the substrate includes:
        a display area displaying an image; and
        a peripheral area surrounding the display area,
    the display area includes a first display area and a second display area, and
    the second display area is positioned between the first display area and the peripheral area.

9. The display device of claim 8, wherein
    a portion of the driving circuit part overlaps the second light-emitting device in the second display area, and
    another portion of the driving circuit part is positioned in the peripheral area.

10. The display device of claim 1, wherein the signal transfer wire includes:
    a first subwire and a second subwire spaced apart from each other; and
    a plurality of bridge wires that connect the first subwire and the second subwire.

11. The display device of claim 10, wherein
the plurality of bridge wires extend in parallel along a first direction, and
the first subwire and the second subwire extend in parallel in a second direction that is perpendicular to the first direction.

12. The display device of claim 11, wherein the signal transfer wire further includes an opening surrounded by the first subwire, the second subwire, and the plurality of bridge wires.

13. The display device of claim 12, wherein the opening has a polygonal or circular planar shape.

14. The display device of claim 12, wherein
the signal transfer wire includes a plurality of openings, and
the plurality of openings are spaced apart from each other.

15. The display device of claim 12, wherein
the signal transfer wire includes a plurality of openings, and
each of the plurality of openings has a selectable size.

16. The display device of claim 1, wherein the signal transfer wire includes:
a first subwire, a second subwire, and a third subwire spaced apart from each other;
a first bridge wire extending from the first subwire and the second subwire; and
a second bridge wire extending from the second subwire and the third subwire.

17. The display device of claim 16, wherein the first bridge wire and the second bridge wire are positioned on a same extension line.

18. The display device of claim 16, wherein the first bridge wire and the second bridge wire are positioned to cross each other.

19. The display device of claim 1, wherein the second pixel circuit part is connected to a plurality of second light-emitting devices.

20. The display device of claim 19, further comprising:
an extension wire connected to the second pixel circuit part,
wherein the second light-emitting devices are connected to the second pixel circuit part through the extension wire.

* * * * *